(12) United States Patent
Vlassak

(10) Patent No.: US 6,319,727 B1
(45) Date of Patent: Nov. 20, 2001

(54) METHOD FOR MANUFACTURING LOW STRESS METALLIC INTERCONNECT LINES FOR USE IN INTEGRATED CIRCUITS

(75) Inventor: Joost Vlassak, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/246,497

(22) Filed: Feb. 8, 1999

(51) Int. Cl.$^7$ .................................................. H01L 21/44
(52) U.S. Cl. ............................................. 436/652; 438/688
(58) Field of Search .................................... 438/652, 624, 438/641, 680, 688, 783, 778; 257/751

(56) References Cited

U.S. PATENT DOCUMENTS

| | | | |
|---|---|---|---|
| 5,514,622 | 5/1996 | Bornstein et al. | 437/189 |
| 5,675,186 | * 10/1997 | Shen et al. | 257/751 |
| 5,943,601 | * 8/1999 | Usui et al. | 438/688 |
| 6,004,887 | * 12/1999 | Matsuno | 438/783 |

* cited by examiner

Primary Examiner—David Nelms
Assistant Examiner—Dung A Le

(74) Attorney, Agent, or Firm—Stallman & Pollock LLP

(57) ABSTRACT

A process for manufacturing metallic interconnect lines of low stress. Process steps according to the present invention first include a step of providing a semiconductor substrate (e.g. a silicon wafer) with an overlying insulating layer, followed by forming a multi-layer stack on the insulating layer. The multi-layer stack includes at least two adjoining layers: one being a metal M layer (for example an aluminum layer) and the other being a material Q layer, where material Q is a material that forms either (i) an electrically conductive intermetallic layer, or (ii) an electrically conducting solid solution layer, with metal M when subjected to the subsequent thermal treatment step. Silicon and titanium meet this requirement when metal M is aluminum. The multi-layer stack is then pattered to form a multi-layer metallic interconnect line. An interconnect dielectric material layer (e.g. a $SiO_2$ or silicon nitride layer) is subsequently formed at a temperature $T_1$, covering the multi-layer metallic interconnect line. The multi-layer metallic interconnect line and the interconnect dielectric material layer are then thermally treated at a temperature $T_2$ that is greater than $T_1$, in order to reduce the stress (i.e. compressive or tensile) of the multi-layer metallic interconnect line by forming the electrically conductive intermetallic layer or electrically conductive solid solution layer. The result is a low stress metallic interconnect line.

12 Claims, 3 Drawing Sheets

US 6,319,727 B1

METHOD FOR MANUFACTURING LOW STRESS METALLIC INTERCONNECT LINES FOR USE IN INTEGRATED CIRCUITS

BACKGROUND OF THE INVENTION

1. Field of the Invention

The present invention relates to methods for manufacturing integrated circuit structures and, in particular, to methods for manufacturing integrated circuit metal interconnect lines.

2. Description of the Related Art

Typical integrated circuits (ICs) include metal interconnect structures that serve a variety of purposes, including carrying electrical signals between individual device elements in the IC, as well as providing power, a connection to ground and a connection to external apparatus.

FIG. 1 illustrates a portion of a typical metal interconnect structure 10 disposed above an insulating layer 12 on a semiconductor subs interconnect structure 10 includes interconnect dielectric material layer 18, as well as a patterned metal layer, which is made up of individual metal interconnect lines 16A and 16B. Metal interconnect lines 16A and 16B, among other things, carry signals and provide power. Interconnect dielectric material layer 18 provides electrical isolation both between metal interconnect lines (e.g. between metal interconnect lines 16A and 16B) within a given patterned metal layer and between multiple patterned metal layers in a multi-level metal interconnect structure (not shown in FIG. 1). The conventional interconnect dielectric material that constitutes the interconnect dielectric material layer 18 is silicon dioxide ($SiO_2$), although other dielectric materials, such as silicon nitride and low k materials (i.e. materials with a low dielectric constant), are also known to those of skill in the art. Additional metal interconnect structures, such as interconnect contacts and interconnect vias, are known to those skilled in the art, however, they are not shown in FIG. 1 to avoid obscuring those metal interconnect structures that are most relevant to the present invention.

State-of-the art metal interconnect lines often take the configuration of a multi-layer metal stack. FIG. 2 illustrates a typical metal interconnect structure 20 that includes such a multi-layer metal stack interconnect line 22. Multi-layer metal stack interconnect line 22 includes a first layer 24 of titanium, a second layer 26 of titanium-nitride (TiN), a third layer 28 of aluminum with 0.2 to 4.0 wt. % copper, and a fourth layer 30 of TiN. Similar to FIG. 1, the multi-layer metal stack interconnect line 22 is disposed on an insulating layer 12 and covered by an interconnect dielectric material layer 18.

Conventional processes for manufacturing metal interconnect structures with multi-layer metal stack interconnect lines include the steps of first depositing an insulating layer over device elements, such as diodes, transistors and resistors (not shown in FIGS. 1 and 2), that were previously formed in a semiconductor substrate, followed by planarizing the insulating layer. The insulating layer is planarized using, for example, chemical mechanical polishing (CMP) or resist-based etch-back techniques. Interconnect contacts (not shown in FIGS. 1 and 2) are subsequently formed in the insulating layer. A multi-layer metal stack is then formed on the insulating layer. The multi-layer metal stack is composed of, for example, a titanium (Ti) layer with a thickness in the range of 50 angstroms to 400 angstroms. which is underlying a titanium-nitride (TiN) layer with a thickness in the range of 50 angstroms to 400 angstroms, which is in turn underlying an aluminum (Al) layer containing 0.2–4.0 wt. % copper (Cu) with a thickness in the range of 1,000 angstroms to 20,000 angstroms, which is in turn underlying a TiN layer with a thickness in the range of 50 angstroms to 1000 angstroms. Next, the multi-layer metal stack is patterned, using conventional photolithographic and etching techniques, to form a patterned metal layer with metal interconnect lines. An interconnect dielectric material layer is then deposited over the patterned metal layer.

This conventional process of forming metal interconnect lines, however, can lead to several problems. First, if the metal interconnect lines are heated subsequent to the interconnect dielectric material layer deposition step, an undesirably high level of stress (compressive or tensile) can be produced in the metal interconnect lines due to thermal expansion mismatch between the metal interconnect lines and the interconnect dielectric material layer. A high compressive stress can cause a fracture in the interconnect dielectric material layer. A high compressive stress can also cause the metal from the interconnect metal lines to extrude through vias cut in the interconnect dielectric material layer. A high tensile stress can, on the other hand, result in the creation of voids in the metal interconnect lines. Whether under a high compressive stress or under a high tensile stress, the integrity of the metal interconnect structure is compromised.

There is, therefore, still a need in the art for a process for manufacturing low stress metallic interconnect lines.

SUMMARY OF THE INVENTION

The present invention provides a process for manufacturing metallic interconnect lines of low stress. The process includes the steps of first providing a semiconductor substrate (e.g. a silicon wafer) with an overlying insulating layer, followed by the formation of a multi-layer stack on the insulating layer. The multi-layer stack includes at least two adjoining layers: a metal M layer (e.g. an aluminum or aluminum alloy layer) and a material Q layer. Material Q is selected from the group consisting of: (i) materials that form an electrically conductive intermetallic compound with metal M, when subjected to a subsequent thermal treatment step; and (ii) materials that form an electrically conductive solid solution with metal M, when subjected to the subsequent thermal treatment step. An example of material Q for the former is titanium, while an example for the latter is silicon. Therefore, when aluminum is selected as metal M, for instance, either titanium or silicon can be selected as material Q. The multi-layer stack is then pattered to form at least one multi-layer metallic interconnect line. An interconnect dielectric material layer (e.g. a $SiO_2$ or silicon nitride layer) is subsequently formed covering the multi-layer metallic interconnect line using a formation technique with a maximum deposition temperature $T_1$. Next, the multi-layer metallic interconnect line and the interconnect dielectric material layer are thermally treated at a temperature $T_2$ that is greater than the maximum deposition temperature $T_1$, of the dielectric material layer, in order to reduce the stress of the multi-layer metallic interconnect line, thus resulting in a low stress metallic interconnect line.

The low stress metallic interconnect line can be formed in two ways depending upon the type of stress (i.e. compressive or tensile) the multi-layer metallic interconnect line is under prior to the thermal treatment step. In the case where the multi-layer metallic interconnect line is under compressive stress, a low stress metallic interconnect line results from forming, upon the thermal treatment step, either (i) an electrically conductive intermetallic layer of metal M and material Q with a resultant total volume less than the original total volume of the constituents of the electrically conductive intermetallic layer (i.e. when the constituents are in an iuxta position); or (ii) an electrically conductive solid solution layer of metal M and material Q with a resultant total volume less than the original total volume of the constituents of the electrically conductive solid solution layer. On the other hand, in the case where the multi-layer metallic interconnect line is under tensile stress, a low stress metallic interconnect line results by forming, upon the thermal treatment, either (i) an electrically conductive intermetallic layer of metal M and material Q with a resultant total volume greater than the original total volume of the constituents of the electrically conductive intermetallic layer; or (ii) an electrically conductive solid solution layer of metal M and material Q with a resultant total volume greater than the original total volume of the constituents of the electrically conductive solid solution layer.

The basis, mode of operation and benefits of processes according to the present invention are evident in view of the following analysis and description. In general, the stress (p) of a metal interconnect line at a temperature $T_0$, when encapsulated by a rigid interconnect dielectric material layer, is approximately expressed as:

$$p = E \Delta\alpha \Delta T / (1 - 2v) \tag{1}$$

where E and v are the Young's modulus and Poisson's ratio, respectively, of the metal interconnect line, $\Delta\alpha$ is the difference in linear thermal expansion coefficient between the metal interconnect line and the interconnect dielectric material layer, and $\Delta T$ is the temperature difference between the interconnect dielectric material deposition temperature ($T_1$) and $T_0$. Although, in reality, the interconnect dielectric material layer has a finite stiffness, Equation (1) provides an adequate first order approximation of the stress (p). Young's modulus, Poisson's ratio and $\Delta\alpha$ for various metals and interconnect dielectric materials are readily available in the literature, for example in G. Simmons and H. Wong, *Single Crystal Elastic Constants and Calculated Aggregate Properties: A Handbook*, M.I.T. Press, Cambridge (1971).

For a metal interconnect line being primarily composed of aluminum (which has a Young's modulus of approximately 71 GPa and Poisson's ratio of approximately 0.345), and a silicon dioxide ($SiO_2$) interconnect dielectric material layer, the difference in linear thermal expansion coefficient is approximately 20E-6/° C. Assuming a $\Delta T$ of 100° C., the hydrostatic compressive stress in the aluminum metal interconnect line is on the order of 460 MPa. This compressive tress can be large enough to crack the interconnect dielectric material layer which surrounds the metal interconnect line.

Using appropriate modeling techniques (e.g. finite element analysis using well known commercially available software packages) or through experimentation, the optimum temperature $T_2$ at which to thermally treat the multi-layer stack and the interconnect dielectric material layer to convert material Q from the material Q layer and metal M from the metal M layer to either (i) an electrically conductive intermetallic layer of metal M and material Q; or (ii) an electrically conductive solid solution layer of metal M and material Q, can be determined. When the material Q layer is composed of Ti or Si with a thickness of 20–400 angstroms and the adjoining metal layer M is composed of Al or an alloy of Al with a thickness of 4500 angstroms, a typical thermal treatment step in processes according to the present invention would be conducted at a temperature $T_2$ of from 300° C. to 450° C. for a time period in the range of a few minutes to 1 hour. Other temperatures and times can be employed depending on the particular choice of material Q, metal M and the thickness thereof.

After the thermal treatment step, and again assuming that the metal interconnect line is encapsulated by the rigid interconnect dielectric material layer, the stress in the metallic interconnect line is reduced by approximately $P_r$, where:

$$p_r = E \delta_v / 3(1 - 2v) \tag{2}$$

where $\delta_v$ is the volumetric strain induced in the multi-layer metallic interconnect line when M and Q react to form either (i) an electrically conductive intermetallic layer of metal M and material Q; or (ii) an electrically conductive solid solution layer of metal M and material Q. Volumetric strain values can be determined experimentally or from the literature, for example from H. W. King, King's table, in *Journal of Materials Science*, Vol. 1,79 (1966).

Employing the equations listed above and material properties readily available in the literature, examples of the stress reduction that is theoretically possible in a 4500 angstrom thick Al metal line using processes according to the present invention can be calculated. Such calculated data are presented in the table below.

TABLE 1

| Material Q | Material Q Layer Thickness | $\delta_v$ | Stress Change ($p_r$) |
|---|---|---|---|
| Ti | 22.5 angstroms | −0.0011 | −80 MPa |
| Ti | 45 angstroms | −0.0021 | −161 MPa |
| Ti | 90 angstroms | −0.0043 | −322 MPa |
| Si | 45 angstroms | −0.0018 | −137 MPa |
| Si | 90 angstroms | −0.0026 | −273 MPa |

Combining equations (1) and (2) above, it follows that if the stress in a conventional metal interconnect line causes problems (i.e. fractures and creation of voids in, and metal extrusion from, the metal interconnect lines) at a given processing temperature $T_p$, low stress metallic interconnect lines formed by processes according to the present invention will not experience similar problems until a higher processing temperature $T_n$ is reached, where $T_n$ is approximately:

$$T_n = T_p + \delta_v / 3 \Delta\alpha \tag{3}$$

Therefore, according to Equation (3), the maximum temperature at which a metal interconnect structure remains intact can be greatly increased using processes in accordance with the present invention, with the increase depending on the nature of material Q and the associated value of $\delta_v$.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

FIGS. 3–7 illustrate stages in a process in accordance with the present invention. First, a semiconductor substrate 100

Figure 1:
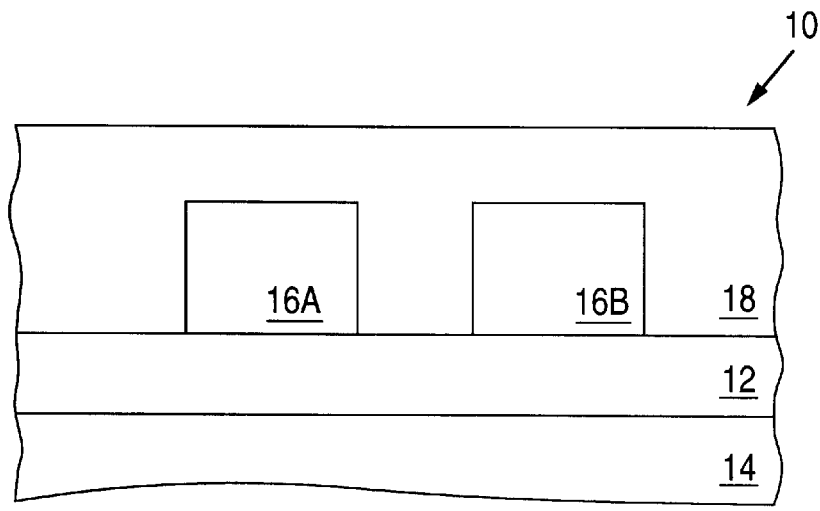
FIG. 1 is a cross-sectional view illustrating a portion of conventional metal interconnect structure.
Figure 2:
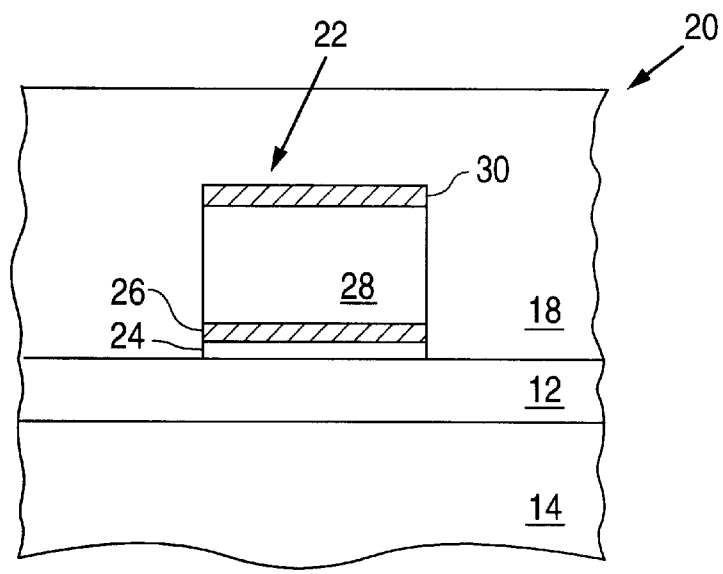
FIG. 2 is a cross-sectional view depicting a typical metal interconnect structure that includes a multi-layer metal stack interconnect line.
Figure 3:
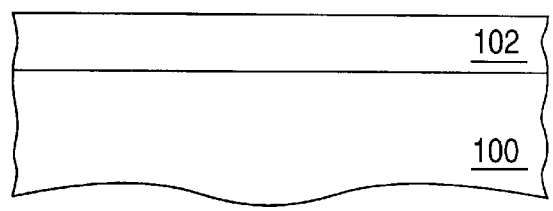
FIGS. 3–7 are cross-sectional views illustrating stages in a process in accordance with the present invention.

(e.g. a silicon substrate) with an overlying insulating layer 102 is provided, as illustrated in FIG. 3. Semiconductor substrate 100 can be a silicon wafer at any stage during the fabrication of an integrated circuit, including those stages where multiple patterned and/or unpatterned layers and devices (e.g. transistors, diodes, resistors, etc.) are on the surface of the wafer in addition to the insulating layer 102.

Figure 4:
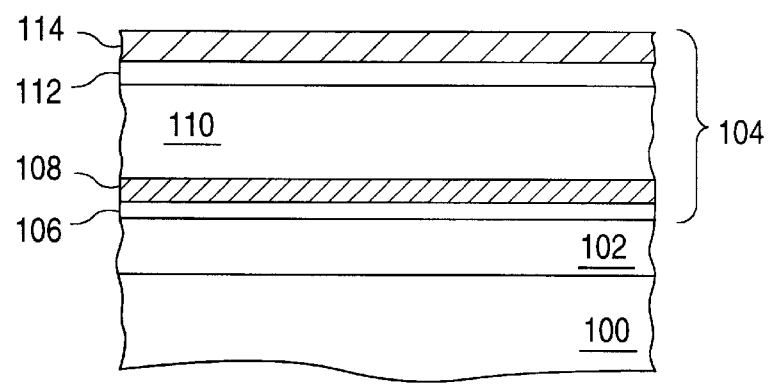

Next, a multi-layer stack 104 is deposited on the insulating layer 102, using conventional techniques known in the art. The resulting structure is shown in FIG. 4. The multi-layer stack 104 is composed of a first layer 106 of titanium with a thickness in the range of 50 angstroms to 400 angstroms; a second layer 108 of titanium-nitride (TiN) with a thickness in the range of 50 angstroms to 400 angstroms; a third layer 110 of metal M (e.g. aluminum with 0.2 to 4.0 wt. % Cu) with a thickness in the range of 1,000 to 20,000 angstroms; a fourth layer 112 of material Q (e.g. a Ti or Si layer) with a thickness in the range of 20 to 400 angstroms; and a fifth layer 114 of antireflective coating (ARC), such as TiN, with a thickness in the range of 50 angstroms to 1000 angstroms. It is critical that the multi-layer stack 104 includes at least two adjoining layers: one being a metal M layer and the other being a material Q layer. The number of layers in the multi-layer stack 104, their sequence and their composition can, otherwise, be varied depending on the process technology used to fabricate the integrated circuit and the desired operating characteristics of the final integrated circuit.

The material Q layer (i.e. fourth layer 112) is formed of a material Q that forms either (i) an electrically conductive intermetallic layer; or (ii) an electrically conductive solid solution layer with metal M (from the metal M layer) upon thermal treatment at a temperature $T_2$ (as explained further below). An additional characteristic of material Q is that the total volume occupied by the constituents of the electrically conductive intermetallic layer (or the electrically conductive solid solution layer) upon the thermal treatment step is either (a) less than, or (b) more than, that of the constituents prior to the thermal treatment step, depending on whether the objective of forming a low stress metallic interconnect line is to (a) decrease a compressive stress or (b) decrease a tensile stress, respectively, in the multi-layer metallic interconnect line. For example, the material Q layer can be formed of either Ti or Si, and the deposition sequence of layers can be such that the material Q layer is disposed either immediately on or immediately underneath a metal M layer of Al containing 0.2–4.0 wt. % Cu. The thickness of the material Q layer is determined by the desired volume contraction that needs to take place when the electrically conductive intermetallic layer (or electrically conductive solid solution) is formed during the subsequent thermal treatment step, in order to reduce compressive stress. Similarly, the thickness of the material Q layer is determined by the desired volume expansion that needs to occur when the electrically conductive intermetallic layer (or electrically conductive solid solution) is formed during the subsequent thermal treatment step, in order to reduce tensile stress. For the circumstance where the metal M layer is primarily aluminum (Al) with a thickness of approximately 4500 angstroms, an adjoining material Q layer of either Ti or Si can have a thickness in the range of 20 angstroms to 400 angstroms.

Figure 5:
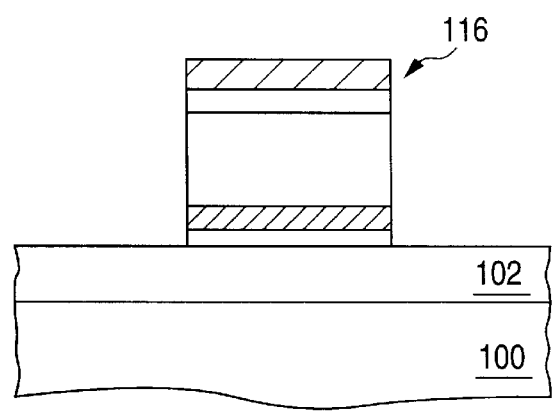

Next the multi-layer stack 104 is patterned to form a multi-layer metallic interconnect line 116, as illustrated in FIG. 5. Standard metal interconnect photolithographic and etching techniques can be used to pattern the multi-layer stack 104, if titanium is employed as material Q. If materials other than Ti are used as material Q, the etching technique may have to be modified in a manner which can be readily determined by one of skill in the art.

Figure 6:
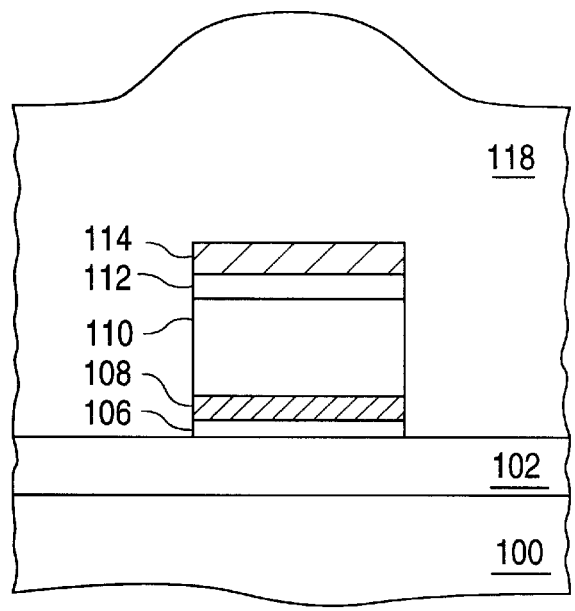

An interconnect dielectric material layer 118 is then formed covering the multi-layer metallic interconnect line 116, as shown in FIG. 6, at a maximum deposition temperature of $T_1$. The interconnect dielectric material which constitutes interconnect dielectric material layer 118 can be, for example, silicon dioxide, silicon nitride or a low k material, such as a Spin-On-Glass (SOG). The formation of interconnect dielectric material layer 118 can be accomplished using conventional processes. Although the maximum deposition temperature ($T_1$) of the interconnect dielectric material layer depends on the technique used, a maximum temperature of between 200° C. and 400° C. is typically used in conventional silicon dioxide interconnect dielectric material layer deposition processes. The thickness of the interconnect dielectric material layer 118 is predetermined based on the manufacturing process technology, however, a typical thickness range would be from 5000 angstroms to several microns.

Figure 7:
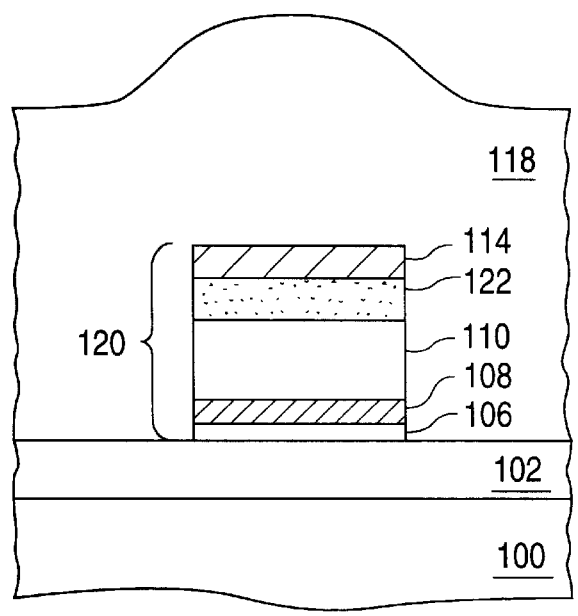

Next, the multi-layer metallic interconnect line 116 and the interconnect dielectric material layer 118 are thermally treated at a temperature $T_2$ that is higher than the maximum deposition temperature ($T_1$) of the interconnect dielectric material layer, in order to reduce the stress (i.e. compressive or tensile) of the multi-layer metallic interconnect line 116, thereby forming a low stress metallic interconnect line 120. The stress reduction is accomplished by the formation of either (i) an electrically conductive intermetallic layer 122 of metal M and material Q, or (ii) an electrically conductive solid solution layer 122 of metal M and material Q, depending on a given metal M and material Q combination, during the thermal treatment step. The resultant structure is shown in FIG. 7.

The temperature $T_2$ of the thermal treatment step is above the maximum deposition temperature ($T_1$) of the interconnect dielectric material layer, but below the temperature where problems, such as cracking of the interconnect dielectric material layer, or extrusion of the metal layers or creation of voids in the metal layers, may occur. For example, if the interconnect dielectric material layer 118 is deposited at 350° C., the subsequent thermal treatment step can be performed at a temperature of greater than 350° C., for example at 400° C. The typical temperature range for $T_2$ is from 300° C. to 450° C. for a period of a few minutes to approximately 1 hour. Whether or not any of the material Q layer remains after the thermal treatment step depends on the thickness of the material Q layer, as well as the thermal treatment process time and temperature $T_2$ that is employed. Typically, the thickness of the fourth layer (i.e. the material Q layer) 112 would be only enough to provide an electrically conductive intermetallic layer or electrically conductive solid solution layer 122 with a thickness and volume contraction (or expansion) that provides the desired reduction in compressive (or tensile) stress). However, depending on the details of the technology, a portion of the material Q layer may remain after the thermal treatment step for, for example, adhesion purposes.

In the circumstance where the material Q layer is a Ti layer and the metal M layer is an Al layer, the Al and Ti will diffuse into each other and react to form an electrically conductive intermetallic layer ($Al_3Ti$) during the thermal treatment step. Such a resultant $Al_3Ti$ layer has a smaller total volume than the original total volume occupied by the individual Ti and Al constituents prior to the thermal treatment step. The ratio of metal M to material Q that is consumed during the thermal treatment step depends on the particular combination of metal M and material Q employed in the process. In a case where material Q is Ti and metal M is Al, approximately 1 volume of Ti will be consumed for every 3 volumes of Al consumed.

Conventional metal interconnect lines have a resistance, which is a function of their dimensions, of between 10 and 100 milli-ohms per square. For a half micron metal interconnect line, the resistance can be in the order of 60 milli-ohms/square. Low stress metallic interconnect lines manufactured by processes in accordance with the present invention can have a resistance that is 10–15% greater than conventional metal interconnect lines due to the presence of the additional electrically conductive intermetallic layer or electrically solid solution layer. Such an increase in resistance, if any, will depend on the nature of the material Q that is employed in the process.

It should be understood that various alternatives to the embodiments of the invention described herein may be employed in practicing the invention. For example, while specific thicknesses, temperatures, and times have been set forth to illustrate the invention, they are not intended to limit the invention. It is intended that the following claims define the scope of the invention and that processes within the scope of these claims and their equivalents be covered thereby.

What is claimed is:

1. A method for manufacturing a low stress metallic interconnect line, the method comprising:
    forming a first layer of dielectric material on a semiconductor substrate;
    forming a multi-layer stack on the first layer of dielectric material;
    patterning the multi-layer stack to form at least one multi-layer metallic interconnect line;
    depositing a second dielectric material layer to cover the multi-layer metallic interconnect line using a deposition temperature that does not exceed a first temperature valve $T_1$; and
    thermally treating the multi-layer metallic interconnect line and the second dielectric material layer at a thermal treatment temperature valve $T_2$ that is greater than the first temperature valve $T_1$,
    wherein the step of forming a multi-layer stack includes forming at first and second layers, the first adjoining layers being a metal M layer and the second adjoining layer being a material Q layer, where material Q is selected from the group consisting of materials that form an electrically conductive intermetallic layer with metal M when subjected to the thermally treating step and materials that form an electrically conductive solid solution layer with metal M when subjected to the thermally treating step.

2. The method of claim 1, and wherein the thermally treating step includes forming an electrically conductive intermetallic layer of metal M and material Q having a total volume occupied by the metal M and the material Q of the electrically conductive intermetallic layer subsequent to the thermally treating step that is less than a total volume occupied by the metal M and the material Q prior to the thermally treating step.

3. The method of claim 1, and wherein the thermally treating step includes forming an electrically conductive intermetallic layer of metal M and material Q having a total volume occupied by the metal M and the material Q of the electrically conductive intermetallic layer subsequent to the thermally treating step that is greater than a total volume occupied by the metal M and the material Q prior to the thermally treating step.

4. The method of claim 1, and wherein the thermally treating step includes forming an electrically conductive solid solution layer of metal M and material Q having a total volume occupied by the metal M and the material Q of the electrically conductive solid solution layer subsequent to the thermally treating step that is less than a total volume occupied by the metal M and material Q prior to the thermally treating step.

5. The method of claim 1, and wherein the thermally treating step includes forming an electrically conductive solid solution layer of metal M and material Q having a total volume occupied by the metal M and the material Q of the electrically conductive solid solution layer subsequent to the thermally treating step that is greater than a total volume occupied by the metal M and material Q prior to the thermally treating step.

6. The method of claim 1, and wherein the step of forming a multi-layer stack includes depositing a metal M layer with an alloy of aluminum and copper as metal M and depositing a material Q layer with titanium as material Q.

7. The method of claim 6 wherein the step of forming a multi-layer stack includes depositing a material Q layer with a thickness in the range of 20 angstroms to 400 angstroms.

8. The method of claim 7, and wherein the step of depositing an interconnect dielectric material layer is conducted at a maximum interconnect dielectric material layer deposition temperature $T_2$ in the range of 200° C. to 400° C.

9. The method of claim 7, and wherein the thermally treating step is conducted at a thermal treatment temperature $T_2$ in the range of 300° C. to 450° C.

10. The method of claim 1, and wherein the step of forming a multi-layer stack includes depositing an alloy of aluminum and copper as metal M and depositing silicon as material Q.

11. The method of claim 10, and wherein the step of forming a multi-layer stack includes depositing a material Q layer with a thickness in the range of 20 angstroms to 400 angstroms.

12. A method of manufacturing a low stress metallic interconnect line, the method comprising:
    forming a first layer of dielectric material on a semiconductor substrate;
    forming a multi-layer stack on the first layer of dielectric material, the multi-layer stack including first and second adjoining layers: the first adjoining layer being aluminum and the second adjoining layer being a material Q selected from the material group consisting of titanium and silicon;
    patterning the multi-layer stack to form at least one multi-layer metallic interconnect line;
    depositing an $SiO_2$ interconnect dielectric material layer covering the multi-layer metallic interconnect line deposition temperature $T_1$ in the range of 200° C. to 400° C.; and
    thermally treating the multi-layer metallic interconnect line and the SiO2 interconnect dielectric material layer at a thermal treatment temperature $T_2$ is in the range of 300° C. to 450° C., thereby reducing the stress of the multi-layer metallic interconnect line by forming an electrically conductive intermetallic layer that includes aluminum and material Q.

* * * * *